(12) United States Patent
Lin et al.

(10) Patent No.: US 10,181,568 B2
(45) Date of Patent: Jan. 15, 2019

(54) FLEXIBLE DISPLAY PANEL AND DISPLAY DEVICE

(71) Applicant: XIAMEN TIANMA MICRO-ELECTRONICS CO., LTD., Xiamen (CN)

(72) Inventors: Hong Lin, Xiamen (CN); Shui He, Xiamen (CN); Yong Yuan, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 98 days.

(21) Appl. No.: 15/618,126

(22) Filed: Jun. 9, 2017

(65) Prior Publication Data

US 2018/0233682 A1    Aug. 16, 2018

(30) Foreign Application Priority Data

Feb. 15, 2017   (CN) .......................... 2017 1 0080934

(51) Int. Cl.
| | |
|---|---|
| *H01L 27/14* | (2006.01) |
| *H01L 51/00* | (2006.01) |
| *H01L 27/32* | (2006.01) |
| *B32B 27/06* | (2006.01) |

(52) U.S. Cl.
CPC .......... *H01L 51/0097* (2013.01); *B32B 27/06* (2013.01); *H01L 27/3276* (2013.01); *H01L 27/3241* (2013.01); *H01L 2251/5338* (2013.01); *H01L 2251/566* (2013.01)

(58) Field of Classification Search
USPC .......................................................... 257/72
See application file for complete search history.

(56) References Cited

U.S. PATENT DOCUMENTS

2013/0112984 A1*   5/2013  Kim .................... H01L 51/0096
                                                                257/72
2015/0311468 A1*  10/2015  An ........................ H01L 51/529
                                                                257/40

FOREIGN PATENT DOCUMENTS

| CN | 104795403 A | 7/2015 |
|---|---|---|
| CN | 105702624 A | 6/2016 |
| CN | 205609526 U | 9/2016 |

* cited by examiner

*Primary Examiner* — Brook Kebede
(74) *Attorney, Agent, or Firm* — Kilpatrick Townsend & Stockton LLP

(57) ABSTRACT

A flexible display panel and a display device are provided. The flexible display panel includes: a first flexible substrate, a second flexible substrate, and an inorganic layer located between the first flexible substrate and the second flexible substrate; where there are a plurality of grooves and/or through-holes in the inorganic layer; and the first flexible substrate contacts the second flexible substrate through the grooves and/or the through-holes. In this way, the grooves and/or the through-holes are arranged in the inorganic layer so that the first flexible substrate can contact with the second flexible substrate through the grooves and/or the through-holes to thereby increase the contact area between the second flexible substrate and the inorganic layer so as to alleviate the risk of the organic layer being stripped off the inorganic layer in the flexible display panel being bent and deformed.

18 Claims, 3 Drawing Sheets

FLEXIBLE DISPLAY PANEL AND DISPLAY DEVICE

CROSS REFERENCE TO RELATED APPLICATION

This application claims priority to Chinese Patent Application No. 201710080934.4, filed with the Chinese Patent Office on Feb. 15, 2017. The entire disclosure of the above application is incorporated herein by reference.

FIELD

The present disclosure relates to the field of display technologies, and particularly to a flexible display panel and a display device.

BACKGROUND

At present, display technologies have been widely used to TV sets, mobile phones, and for published information, and particularly a tablet display for displaying a picture has been greatly popularized due to its advantages of ultra-small thickness and energy-saving. A flexible display is a prospective display technology in that portable and fashionable display devices are becoming favored in the market. Unlike a conventional organic light-emitting display, a substrate of a flexible organic light-emitting display needs to be made of a flexible organic material to thereby enable the display to be bent and deformed.

In the prior art, the substrate of the flexible organic light-emitting display is typically structured in a plurality of stacked layers including a first organic layer, an inorganic layer, and a second organic layer, but if the substrate of the flexible organic light-emitting display structured in a plurality of layers is bent repeatedly, then there may be such a risk that the organic layer tends to be stripped off the inorganic layer. In view of this problem, an existing solution is to deposit hydrogenated amorphous silicon between the inorganic layer and the second organic layer to thereby improve the adhesion factor between the first organic layer and the second organic layer due to an adhesive layer of amorphous silicon capable of being strongly bonded with H in the flexible organic material (e.g., polyimide) (see Chinese Patent No. CN 104637438 A). However the display is manufactured by firstly depositing amorphous silicon on a glass substrate, then coating polyimide, and after a subsequent process is performed, heating the substrate at high temperature for dehydrogenization to thereby lower the content of hydrogen in amorphous silicon and polyimide so as to weaken the adhesion factor between amorphous silicon and polyimide, thus facilitating a subsequent stripping process. Consequently the solution where the adhesive layer is formed from amorphous silicon bonded with hydrogen in the flexible organic material (e.g., polyimide) may not be highly feasible in that there is such a dehydrogenization process at high temperature in a poly-silicon process at low temperature that may suffer from the risk of amorphous silicon being stripped from the organic layer.

In view of this, it is highly desirable problem for those skilled in the art to improve the adhesion factor between the organic layer and the inorganic layer in the substrate of a plurality of layers of the flexible display panel so as to lower the risk of the organic layer being stripped from the inorganic layer in the flexible display panel being bent and deformed.

SUMMARY

Embodiments provide a flexible display panel and a display device so as to address the problem in the prior art of such an adhesion factor between the organic layer and the inorganic layer in the substrate of the flexible display panel structured in a number of layers that the organic layer tends to be stripped from the inorganic layer after the substrate is bent and deformed repeatedly.

An embodiment provides a flexible display panel including: a first flexible substrate, a second flexible substrate, and an inorganic layer located between the first flexible substrate and the second flexible substrate; wherein:

there are a plurality of grooves and/or through-holes in the inorganic layer; and the first flexible substrate contacts the second flexible substrate through the grooves and/or the through-holes.

An embodiment in accordance with the disclosure further provides a display device including the flexible display panel above according to the embodiment of the disclosure.

Advantageous effects of the embodiments are as follows:

The embodiments provide a flexible display panel and a display device, and the flexible display panel includes: a first flexible substrate, a second flexible substrate, and an inorganic layer located between the first flexible substrate and the second flexible substrate; where there are a plurality of grooves and/or through-holes in the inorganic layer; and the first flexible substrate contacts the second flexible substrate through the grooves and/or the through-holes. In this way, the grooves and/or the through-holes are arranged in the inorganic layer so that the first flexible substrate can contact with the second flexible substrate through the grooves and/or the through-holes to thereby increase the contact area between the second flexible substrate and the inorganic layer so as to improve the adhesion factor between the first flexible substrate and the second flexible substrate, and to alleviate the risk of the organic layer being stripped off the inorganic layer in the flexible display panel being bent and deformed.

DETAILED DESCRIPTION

Particular implementations of the flexible display panel and the display device according to the embodiments of the disclosure will be described below in details with reference to the drawings.

Figure 1:
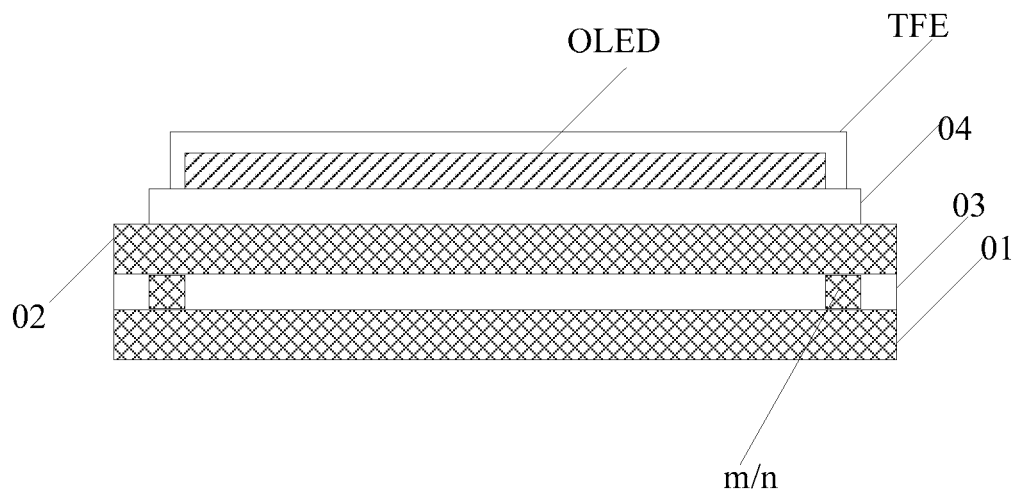
FIG. 1 is a schematic structural diagram of film layers in a flexible display panel according to an embodiment of the disclosure.

An embodiment provides a flexible display panel as illustrated in FIG. 1, which can include: a first flexible substrate 01, a second flexible substrate 02, and an inorganic layer 03 located between the first flexible substrate 01 and the second flexible substrate 02; where there are a plurality of grooves m and/or through-holes n in the inorganic layer 03; and the first flexible substrate 01 contacts the second flexible substrate 02 through the grooves m and/or the through-holes n.

The flexible display panel above according to the embodiment can be a flexible organic light-emitting display panel, and as illustrated in FIG. 1, an array substrate 04, Organic Light-Emitting Devices (OLEDs), and a package layer TFE are located above the second flexible substrate 02 in that order. The grooves and/or the through-holes are formed in the inorganic layer between the first flexible substrate and the second flexible substrate. That is, a plurality of grooves and/or through-holes are arranged in the inorganic layer so that the first flexible substrate contacts the second flexible substrate through the grooves and/or the through-holes, thus increasing the contact area between the second flexible substrate and the inorganic layer so as to improve the adhesion factor between the first flexible substrate and the second flexible substrate, and to alleviate the risk of the organic layer being stripped off the inorganic layer in the flexible display panel being bent and deformed.

Figure 2:
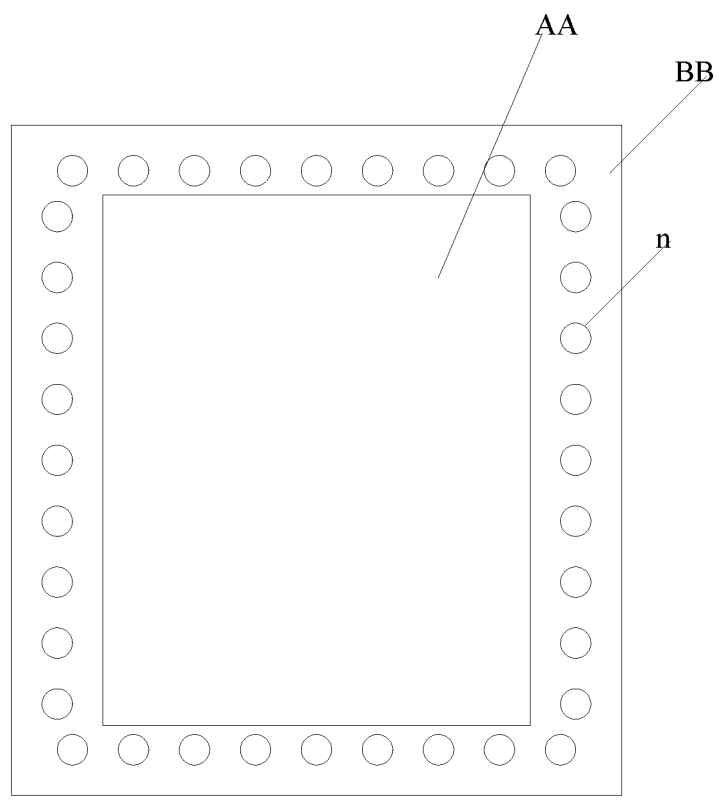
FIG. 2 shows the distribution of peripheral through-holes on a flexible display panel according to an embodiment of the disclosure.
Figure 3:
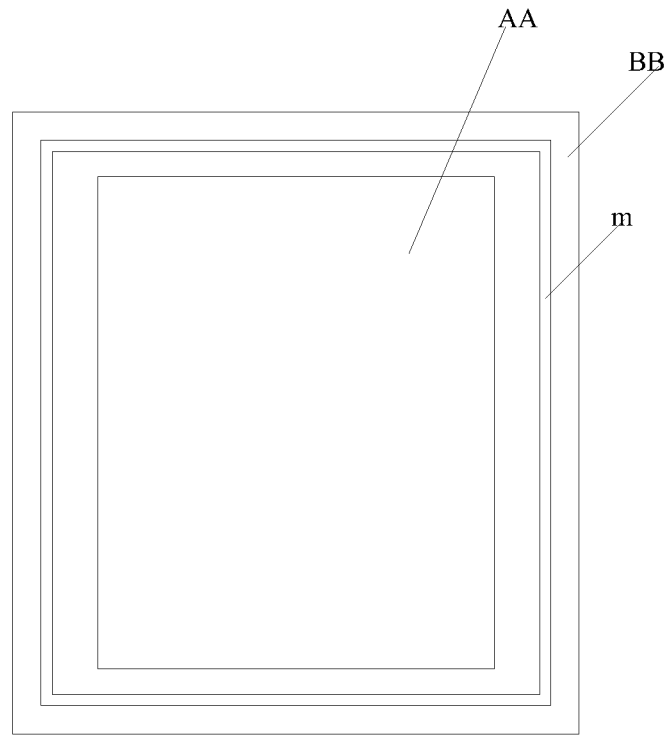
FIG. 3 shows the distribution of peripheral grooves on a flexible display panel according to an embodiment of the disclosure.

In one implementation, in the flexible display panel above according to the embodiments of the disclosure, as illustrated in FIG. 2 and FIG. 3, the grooves m and/or the through-holes n can be located in a peripheral area BB and/or a central area AA of the inorganic layer, where the central area AA corresponds to a display area of the flexible display panel, and the peripheral area BB surrounds the central area AA. As illustrated in FIG. 2, the through-holes n can be designed in the peripheral area BB of the inorganic layer corresponding to the flexible display panel so that the through-holes n located in the peripheral area BB can be distributed uniformly to surround the central area AA. Alternatively, as illustrated in FIG. 3, the grooves m can be designed in the peripheral area BB of the inorganic layer corresponding to the flexible display panel so that the grooves m located in the peripheral area BB can be connected consecutively with each other to form such an edge frame of the grooves that surrounds the central area AA.

Figure 4:
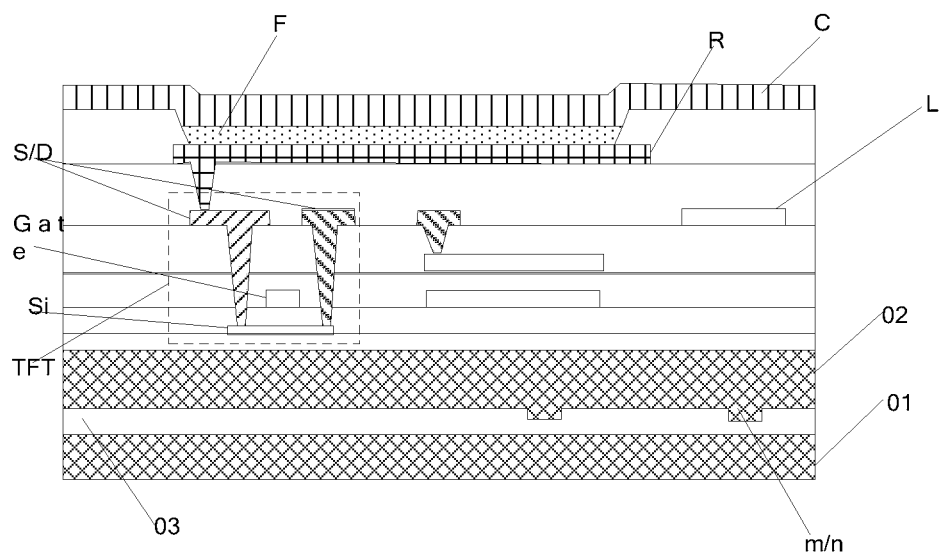
FIG. 4 is a schematic structural diagram of film layers in a flexible display panel according to an embodiment of the disclosure.
Figure 5:
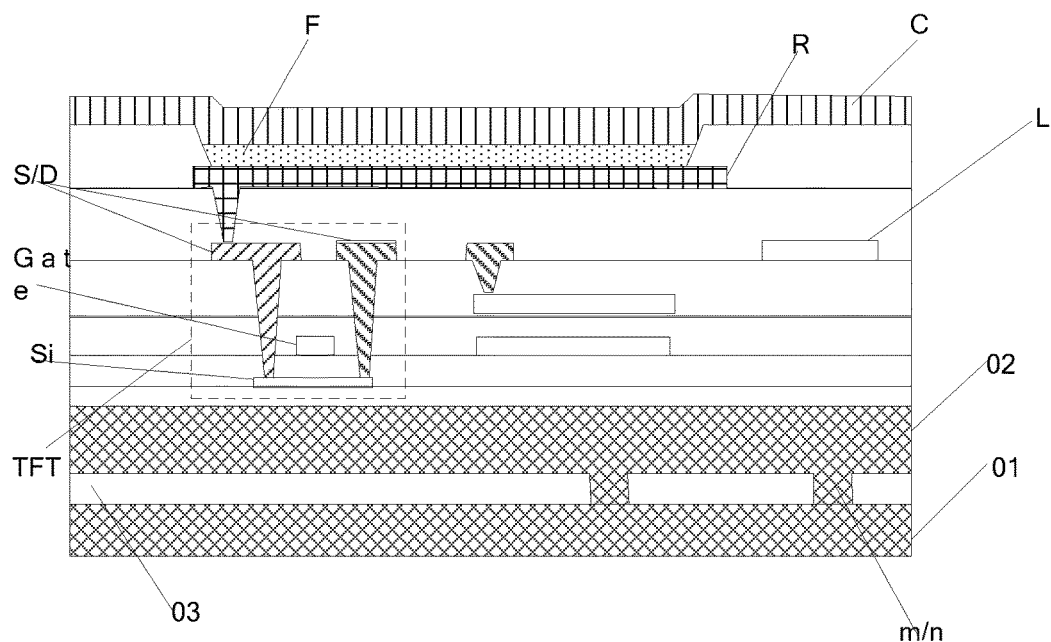
FIG. 5 is a schematic structural diagram of film layers in a flexible display panel according to another embodiment of the disclosure.

In one implementation, in the flexible display panel above according to the embodiments of the disclosure, as illustrated in FIG. 4 and FIG. 5, the flexible display panel can further include a plurality of metal wires L located in the display area, where positive projections of the grooves m and the through-holes n located in the central area onto the first flexible substrate 01 lie in an area of positive projections of the metal wires L in the corresponding area onto the first flexible substrate 01. Since the grooves and the through-holes in the display area need to be designed so that they are absent in an area where TFTs are located, the grooves and the through-holes can be designed in such an area of the inorganic layer that corresponds to the metal wires. Taking the grooves m as an example, as illustrated in FIG. 4, the grooves m can be designed not to penetrate the inorganic layer to thereby increase the contact area between the second flexible substrate 02 and the inorganic layer 03 so as to improve the adhesion factor between the second flexible substrate 02 and the inorganic layer 03; or as illustrated in FIG. 5, the grooves m can be designed to penetrate the inorganic layer to thereby both increase the contact area between the second flexible substrate 02 and the inorganic layer 03 so as to improve the adhesion factor between the second flexible substrate 02 and the inorganic layer 03, and enable the second flexible substrate 02 to contact the first flexible substrate 01 so as to further improve the adhesion factor between the second flexible substrate 02 and the inorganic layer 03. Furthermore it shall be noted that the flexible display panel can further include other film layer structures, e.g., gate electrodes Gate, source and drain electrodes S/D, an active layer Si, cathodes C, anodes R, a light-emitting layer F, etc., as illustrated in FIG. 4 and FIG. 5, and since the structures and functions of the respective film layers are the same as in the prior art, a detailed description thereof will be omitted here.

Figure 6:
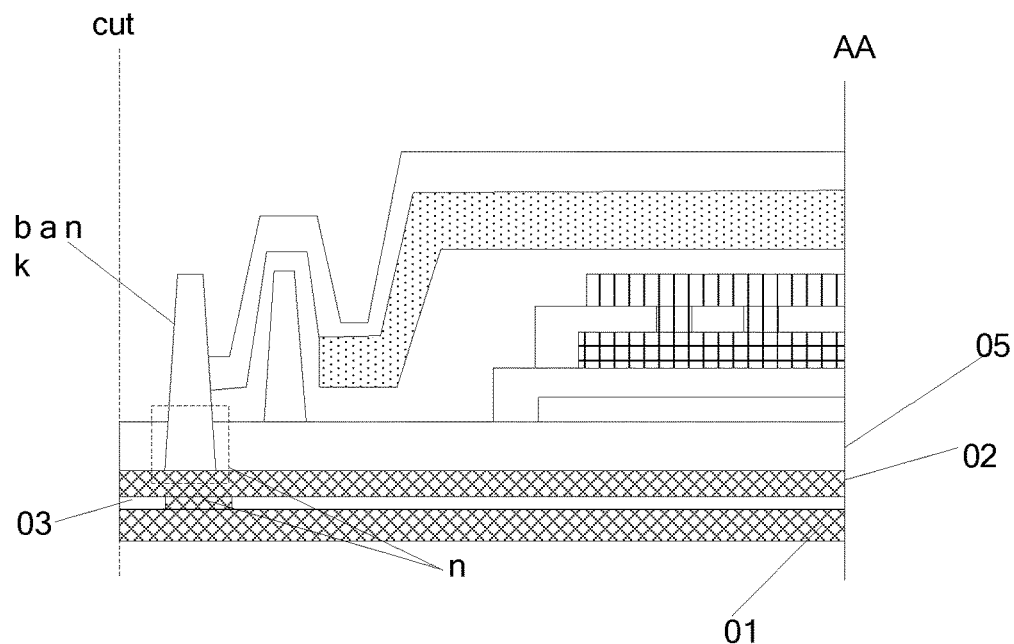
FIG. 6 is a third particular schematic structural diagram of film layers in a flexible display panel according to another embodiment of the disclosure.

In a optional implementation, in the flexible display panel above according to the embodiments of the disclosure, as illustrated in FIG. 6, the flexible display panel can further include: a buffer layer 05 located on the second flexible substrate 02, and a package section Bank located above the buffer layer 05, where there are through-holes n in such an area of the buffer layer 05 that corresponds to the package section Bank, and the package section Bank is connected with the second flexible substrate 02 through the through-holes n. In some examples, the through-holes are arranged in the area of the buffer layer 05 corresponding to the package section so that the package section contacts the second flexible substrate through the through-holes to thereby improve the adhesion factor between the external package structure of the flexible display panel, and the flexible substrate, where the package section is an organic film layer, and the first flexible substrate and the second flexible substrate are organic layers; and the adhesion factor between the respective organic layers is improved so that the adhesion factors between the inorganic between the organic layers, and the adjacent upper and lower organic layers are improved to thereby alleviate the risk of the inorganic layer being stripped off the organic layer, thus improving the overall package of the flexible display panel, which can improve the adhesion factor between the respective layers in the flexible display panel, and alleviate the risk of two of the layers in the flexible display panel being stripped off each other.

In one implementation, in the flexible display panel above according to the embodiments of the disclosure, as illustrated in FIG. 6, there are through-holes n in such an area of the inorganic layer 03 that corresponds to the package section Bank, and the second flexible substrate 02 is connected with the first flexible substrate 01 through the through-holes n. Optionally the through-holes are arranged in the area of the inorganic layer corresponding to the package section so that the second flexible substrate contacts the first flexible substrate through the through-holes to thereby both increase the contact area between the second flexible substrate and the inorganic layer so as to improve the adhesion factor between the first flexible substrate and the second flexible substrate, and also prevent a cut crack from being extended at the inorganic layer while the flexible display panel is being cut (along a cut line "Cut" as illustrated in FIG. 6), so as to improve the resistance of the two flexible substrate layers against moisture and oxygen.

In one implementation, in the flexible display panel above according to the embodiments of the disclosure, a material of which the first flexible substrate and the second flexible substrate is made can be polyimide; and a material of which the inorganic layer is made can be metal or metal oxide.

Based upon the same inventive idea, embodiments provide a display device including the flexible display panel above according to the embodiment of the disclosure. The display device can be applicable to a mobile phone, a tablet computer, a TV set, a display, a notebook computer, a digital photo frame, a navigator, and any other product or component capable of displaying an image. Since the display device addresses the problem under a similar principle to that of the flexible display panel, reference can be made to the implementations of the flexible display panel above for implementations of the display device, so a repeated description thereof will be omitted here.

The embodiments of the disclosure provide a flexible display panel and a display device, and the flexible display panel includes: a first flexible substrate, a second flexible substrate, and an inorganic layer located between the first flexible substrate and the second flexible substrate; where there are a plurality of grooves and/or through-holes in the inorganic layer; and the first flexible substrate contacts the second flexible substrate through the grooves and/or the through-holes. In this way, the grooves and/or the through-holes are arranged in the inorganic layer so that the first flexible substrate can contact with the second flexible substrate through the grooves and/or the through-holes to thereby increase the contact area between the second flexible substrate and the inorganic layer so as to improve the adhesion factor between the first flexible substrate and the second flexible substrate, and to alleviate the risk of the organic layer being stripped off the inorganic layer in the flexible display panel being bent and deformed.

Evidently those skilled in the art can make various modifications and variations to the disclosure without departing from the spirit and scope of the disclosure. Accordingly the disclosure is also intended to encompass these modifications and variations thereto so long as the modifications and variations come into the scope of the claims appended to the disclosure and their equivalents.

The invention claimed is:

1. A flexible display panel, comprising: a first flexible substrate, a second flexible substrate, and an inorganic layer located between the first flexible substrate and the second flexible substrate; wherein:
   there are a plurality of grooves and/or through-holes in the inorganic layer; and
   the first flexible substrate contacts the second flexible substrate through the grooves and/or the through-holes.

2. The flexible display panel according to claim 1, wherein the grooves and/or the through-holes are located in a peripheral area and/or a central area of the inorganic layer; and the central area corresponds to a display area of the flexible display panel, and the peripheral area surrounds the central area.

3. The flexible display panel according to claim 2, wherein the through-holes located in the peripheral area are distributed uniformly to surround the central area.

4. The flexible display panel according to claim 2, wherein the grooves located in the peripheral area are connected consecutively with each other to form such an edge frame of the grooves that surrounds the central area.

5. The flexible display panel according to claim 2, further comprising a plurality of metal wires located in the display area, wherein:
   vertical projections, onto the first flexible substrate, of the grooves and the through-holes located in the central area lie in an area of positive projections of the metal wires in the corresponding area onto the first flexible substrate.

6. The flexible display panel according to claim 1, further comprising a buffer layer located on the second flexible substrate, and a package section located above the buffer layer, wherein:
   there are through-holes in an area that corresponds to the package section, the area being above the inorganic layer and the package section is connected with the second flexible substrate through the through-holes.

7. The flexible display panel according to claim 6, wherein there are through-holes in the area of the inorganic layer corresponding to the package section, and the second flexible substrate is connected with the first flexible substrate through the through-holes.

8. The flexible display panel according to claim 1, wherein a material of which the first flexible substrate and the second flexible substrate is made is polyimide.

9. The flexible display panel according to claim 1, wherein a material of which the inorganic layer is made is metal or metal oxide.

10. A display device, comprising a flexible display panel, wherein the flexible display panel comprises: a first flexible substrate, a second flexible substrate, and an inorganic layer located between the first flexible substrate and the second flexible substrate; wherein:
    there are a plurality of grooves and/or through-holes in the inorganic layer; and
    the first flexible substrate contacts the second flexible substrate through the grooves and/or the through-holes.

11. The display device according to claim 10, wherein the grooves and/or the through-holes are located in a peripheral area and/or a central area of the inorganic layer; and the central area corresponds to a display area of the flexible display panel, and the peripheral area surrounds the central area.

12. The display device according to claim 11, wherein the through-holes located in the peripheral area are distributed uniformly to surround the central area.

13. The display device according to claim 11, wherein the grooves located in the peripheral area are connected consecutively with each other to form such an edge frame of the grooves that surrounds the central area.

14. The display device according to claim 11, wherein the flexible display panel further comprises a plurality of metal wires located in the display area, wherein:
    positive projections, onto the first flexible substrate, of the grooves and the through-holes located in the central area lie in an area of positive projections of the metal wires in the corresponding area onto the first flexible substrate.

15. The display device according to claim 10, wherein the flexible display panel further comprises a buffer layer located on the second flexible substrate, and a package section located above the buffer layer, wherein:
    there are through-holes in an area that corresponds to the package section, the area being above the inorganic layer, and the package section is connected with the second flexible substrate through the through-holes.

16. The display device according to claim 15, wherein there are through-holes in the area of the inorganic layer corresponding to the package section, and the second flexible substrate is connected with the first flexible substrate through the through-holes.

17. The display device according to claim 10, wherein a material of which the first flexible substrate and the second flexible substrate is made is polyimide.

18. The display device according to claim 10, wherein a material of which the inorganic layer is made is metal or metal oxide.

* * * * *